United States Patent [19]

Yee

[11] Patent Number: 4,920,639
[45] Date of Patent: May 1, 1990

[54] METHOD OF MAKING A MULTILEVEL ELECTRICAL AIRBRIDGE INTERCONNECT

[75] Inventor: Ian Y. K. Yee, Austin, Tex.

[73] Assignee: Microelectronics and Computer Technology Corporation, Austin, Tex.

[21] Appl. No.: 389,845

[22] Filed: Aug. 4, 1989

[51] Int. Cl.$^5$ ............................................. H05K 3/02
[52] U.S. Cl. ...................................... 29/846; 29/830; 179/261; 361/410; 204/35.1; 204/38.4
[58] Field of Search ................. 29/846, 830; 174/68.5; 361/410

[56] References Cited

U.S. PATENT DOCUMENTS

| | | | |
|---|---|---|---|
| 3,461,524 | 8/1969 | Lepselter | 174/68.5 X |
| 3,526,541 | 9/1970 | Peltzer | 117/211 |
| 3,528,048 | 9/1970 | Kirk | 337/401 |
| 3,606,677 | 9/1971 | Ryan . | |
| 3,647,585 | 3/1972 | Fritzinger et al. | 174/68.5 X |
| 3,846,166 | 11/1974 | Saiki et al. | 174/68.5 X |
| 4,000,054 | 12/1976 | Marcantonio | 174/68.5 X |
| 4,026,011 | 5/1977 | Walton . | |
| 4,141,055 | 2/1979 | Berry et al. | 174/68.5 X |
| 4,268,956 | 5/1981 | Parks et al. | 29/869 |
| 4,438,560 | 3/1984 | Kisters | 29/830 |
| 4,438,561 | 3/1984 | Mueller | 29/831 |
| 4,480,288 | 10/1984 | Gazdik et al. | 361/398 |

Primary Examiner—Carl J. Arbes
Attorney, Agent, or Firm—Fulbright & Jaworski

[57] ABSTRACT

A method of building a multilevel electrical interconnect supported by metal pillars with air as a dielectric. The metal conductors and metal support pillars are formed using a photo-imagible polymer which serves the function of patterning and also provides a temporary support during construction.

22 Claims, 7 Drawing Sheets

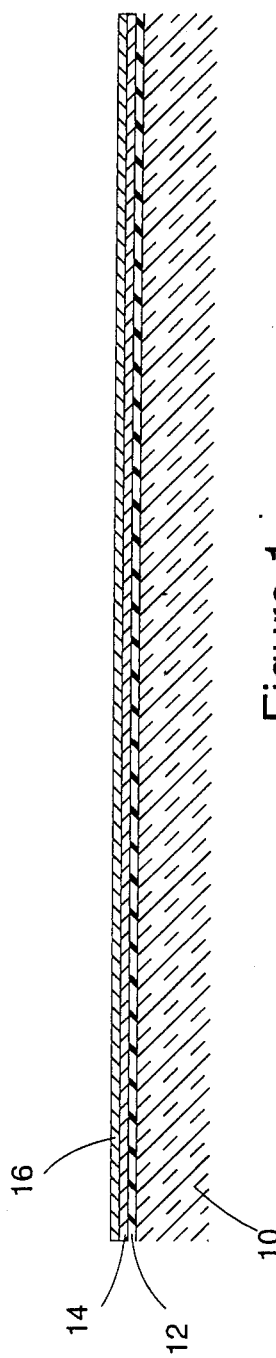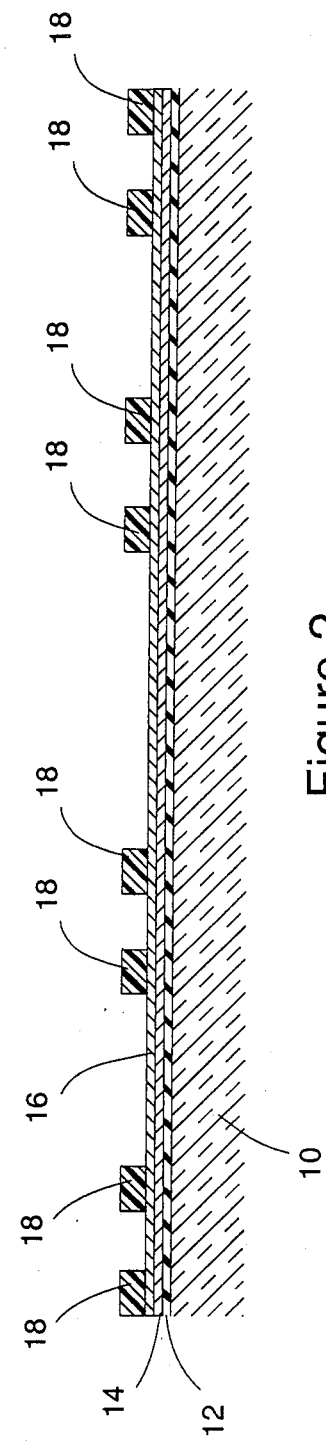

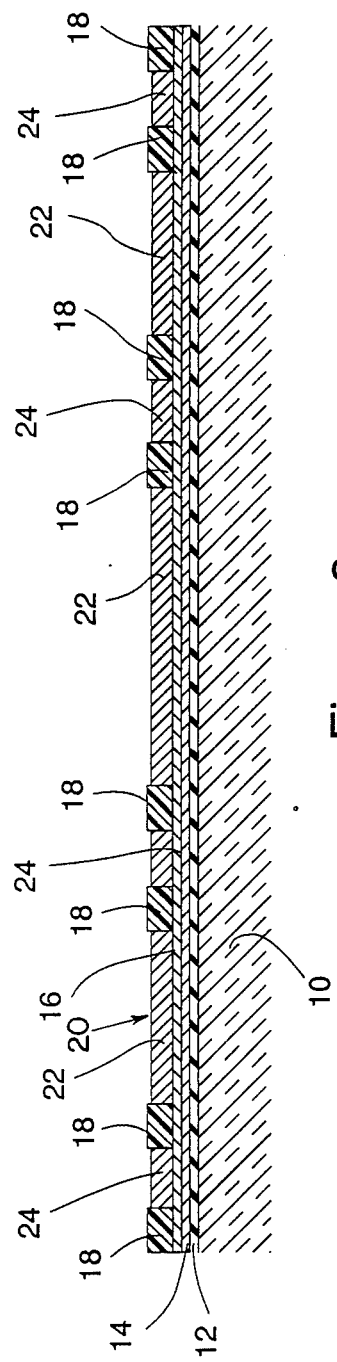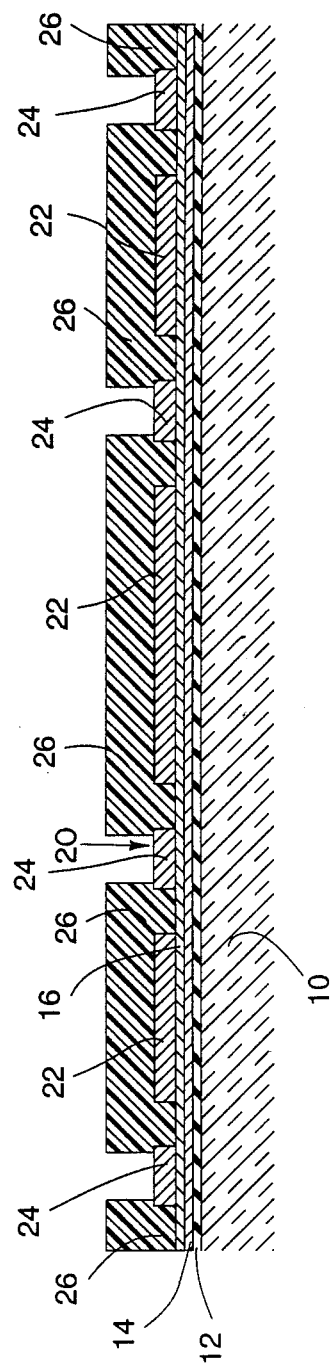

METHOD OF MAKING A MULTILEVEL ELECTRICAL AIRBRIDGE INTERCONNECT

BACKGROUND OF THE INVENTION

The present invention is generally directed to using photoimagible polymers, such as photoresist, as temporary supports for fabricating metal interconnections with air or other dielectric materials as the insulator.

The incorporation of integrated circuits into microelectronics or computers requires a method for interconnecting the various devices with each other or with other systems. However, with the ever increasing complexity of integrated devices with greater numbers of wiring channels and the desire for packing the chips closer together to minimize transmission delays, the need for multilayer and high channel density interconnect substrates is becoming greater. The conventional approach to achieving increased interconnect density has centered on laminating together many wiring layers. This approach is typified by printed circuit board and co-fired ceramic technology. A high performance approach is exemplified by metal/polymer interconnect substrates in which multilayer wiring channels are made by sequentially patterning metals on a substrate, depositing and curing polymers on top, and removing part of the polymer for making interlayer connections as generally described in U.S. Pat. No. 4,810,332.

However, with higher interconnect wiring density, the need for using insulators with low dielectric constants becomes more important for performance reasons. For example, lowering the dielectric constant, if the geometries are kept identical, would decrease signal attenuation, current disturbance, propagation delays, and line cross-talk. Insulators with the lowest dielectric constants include space and gases such as air. Although the use of air as the dielectric is used on a very small scale in high speed gallium arsenide technology, no one had demonstrated airbridge technology in multilevel interconnect systems.

SUMMARY

The present invention is directed to fabricating interconnect substrates with air as the dielectric in a process that uses photo-imagible polymers as temporary supports. The method includes multilevel wiring connectors supported by metal pillars spaced along the span of each conductor. A photopolymer is used to serve a dual function of both patterning the metal interconnects and support pillars and providing temporary support to the metal pans during the multilevel construction, and thereafter is removed leaving an air dielectric, or backfilled with low dielectric materials if desired.

Yet a further object of the present invention is the method of making a multilevel electrical air bridge interconnect by applying a dielectric layer over a substrate, applying an adhesive layer to the dielectric, and applying a thin metal seed layer over the adhesion layer. Thereafter, a photopolymer mask is selectively patterned on the seed layer for forming a first electrical conductor layer and a first part of metal support pillars, and then applying an electrically conductive layer on the unmasked portion of the metal seed layer. A second layer of photopolymer mask is added for forming another part of the support pillars. Then another part of the metal support pillars is applied to the first part of the metal support pillars. A second metal seed layer is applied over the second mask and the other part of the metal pillars. These steps are repeated starting with the application of an electrically conductive layer for building additional levels of metal pillar supported conductors. Thereafter the metal seed layers and the mask layers are sequentially removed leaving electrical conductors supported from metal pillars with an air dielectric therebetween.

Still a further object of the present invention is wherein the removing of the metal seed and the mask layers are separately and sequentially performed beginning at the top of the interconnect.

Still a further object of the present invention is wherein the metal seed layers are applied by evaporation and the conductor layers and pillars are applied by electroplating.

Still a further object of the present invention is wherein the electrical plating of the conductor layers and pillars is electroplated approximately flush with the resist mask prior to applying the next adhesion layers.

Other and further objects, features and advantages will be apparent from the following description of a presently preferred embodiment of the invention, given for the purpose of disclosure, and taken in conjunction with the accompanying drawings.

BRIEF DESCRIPTION OF THE DRAWINGS

FIGS. 1 through 12 are schematic elevational views, illustrating, in sequence, the method of fabricating the multilevel electrical air bridge interconnect of the present invention.

DESCRIPTION OF THE PREFERRED EMBODIMENT

Figure 5:
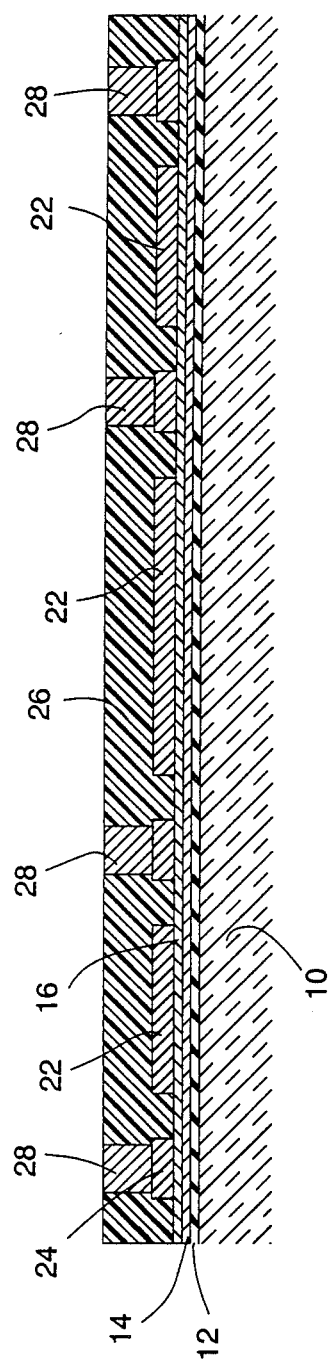

For purposes of illustration, the present method will be described in the fabrication of a three-level copper air bridge on a silicon dioxide coated silicon wafer using positive photoresist as the temporary support and patterning vehicle. However, various other alternative materials may be substituted. Instead of copper, any electro-depositable metal may be used, such as, for example, gold. For the base substrate, any reasonably stiff, flat material can be used, such as ceramic, polymer or glass, with or without inputs and outputs through holes in it. Instead of silicon dioxide as the dielectric on the substrate, other types of dielectrics may be used. Where the base substrate is an insulator a dielectric layer may be omitted. An adhesive layer may also be omitted where an adhesive seed layer is used. Also, instead of a positive resist, negative resist or photo-imagible polyimide may be used.

Referring now to the drawings, and particularly to FIG. 1, the reference numeral 10 generally indicates any suitable substrate. In the preferred embodiment, the substrate 10 is a silicon wafer, although other suitable materials may be used. The substrate 10 is covered with a dielectric layer 12 such as silicon dioxide, although other dielectrics may be used. The substrate 10 and dielectric 12 form an insulating substrate which will serve as the foundation for the air bridges and provide mechanical stability for the interconnect structures to be subsequently built. The insulating dielectric 12 is provided to insure that electrical conductors built thereon will not short together. Therefore, if an insulative substrate is used, the dielectric can be omitted. Over the dielectric 12, or over the substrate 10 if an insulative substrate 10 is used without a dielectric, a thin metal film can be applied to serve as the adhesion layer for subsequent layers. For example, the adhesion layer 14, which may be chromium, is evaporated over the dielectric 12 and thereafter a thin metal seed layer 16, such as copper, is applied such as by conventional evaporation. The thin layer 14 promotes the adhesion between the copper layer and the underlying layer. For example only, the dielectric layer 12 may be 5000 angstroms thick, the chromium adhesive layer 14 may be 500 angstroms thick, and the copper seed layer 16 may be 2500 angstroms thick.

It is important to note that adhesive layer 14 can be omitted if the seed layer 16 adheres directly to the underlying substrate 10 or dielectric 12, whatever the case may be. For example, an aluminum seed layer 16 has been found to adhere well to underlying surfaces.

Referring now to FIG. 2, any suitable photopolymer mask 18 is selectively patterned on the metal seed layer 16. For example, photoresist is used as an electro-forming mask or stencil to selectively electrodeposit metal only on the areas desired. The thickness of the resist should be slightly thicker than the desired thickness of the electro-plated metal to be added. For example, the photo pattern of resist may be 6 microns thick. The photoresist 18 is then used to pattern the first level of electrical conductors and a first part of the metal support pillars.

Referring now to FIG. 3, a second electrically conductive layer 20 is applied on the unmasked portion of the metal seed layer 16. The layer 20 may be of copper which is electroplated. The layer 20 includes sections 22 which form the first layer of an electrical conductor, such as a ground plane, and sections 24 which form a first part of metal support pillars. Preferably, the layer 20 is 5 microns thick. A brief oxygen descum followed by wet etching of the copper should be used prior to electroplating the copper layer 20 to clear residual organics and oxides from the resist openings. This precaution will insure good adhesion between the plated copper 20 and the evaporated copper seed layer 16.

Referring now to FIG. 4, after applying the first pattern electroplating layer 20, more resist 26 is spun on and photopatterned to produce the plating mask for the next part of the support pillars. Thus, for example, another 14 microns of resist 26 is spun on leaving any interlevel conductors and pillar parts exposed. At this point, the total resist thickness is 20 microns and the holes in which the pillars are to be plated are 15 microns each. As an alternative, the first resist layer 18 can be stripped and a total of 26 microns of resist 26 can be spun on. Referring now to FIG. 5, a conductor, for example copper, is applied for forming another part 28 of the copper support and via pillars and/or interlevel connections. This step should plate the copper pillars 28 nearly flush with the surface of the resist 26. This planarization plating process is important so that the subsequent adhesion or seed layer evaporation can be done without any gaps in the film.

Figure 6:
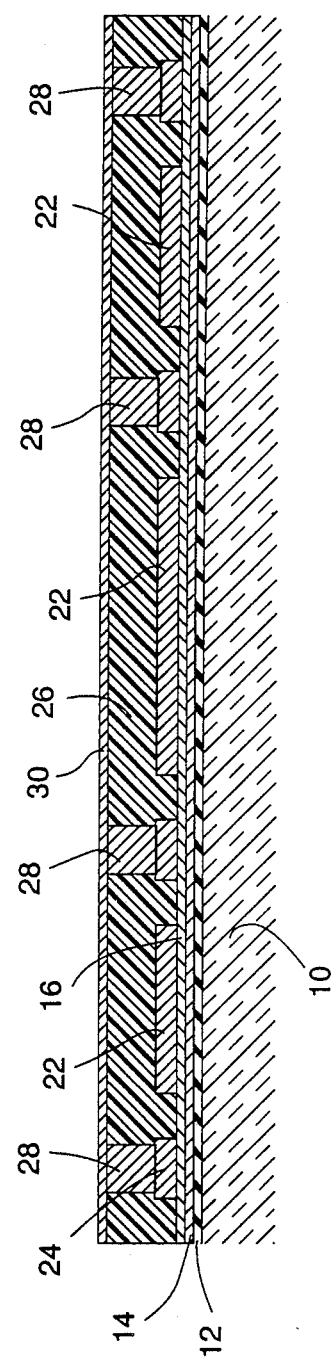

Referring now to FIG. 6, a second metal seed layer 30 is applied over the second mask 26 and the tops of the metal pillars 28 such as by evaporating 2500 angtroms of copper. A problem can occur in this step since positive photoresist (or other polymers) may gas upon exposure to intense radiation or heat. The key in this step is to make sure that most of the polymer solvent has been removed in the steps of FIGS. 2 and 4 using sufficient soft-bakes and post-bakes. In addition, the evaporation should be done quickly as this will minimize the exposure of radiation on the polymer 26. Once the metal seed layer 30 has been deposited, the underlying photoresist 26 becomes partially protected from radiation.

Figure 7:
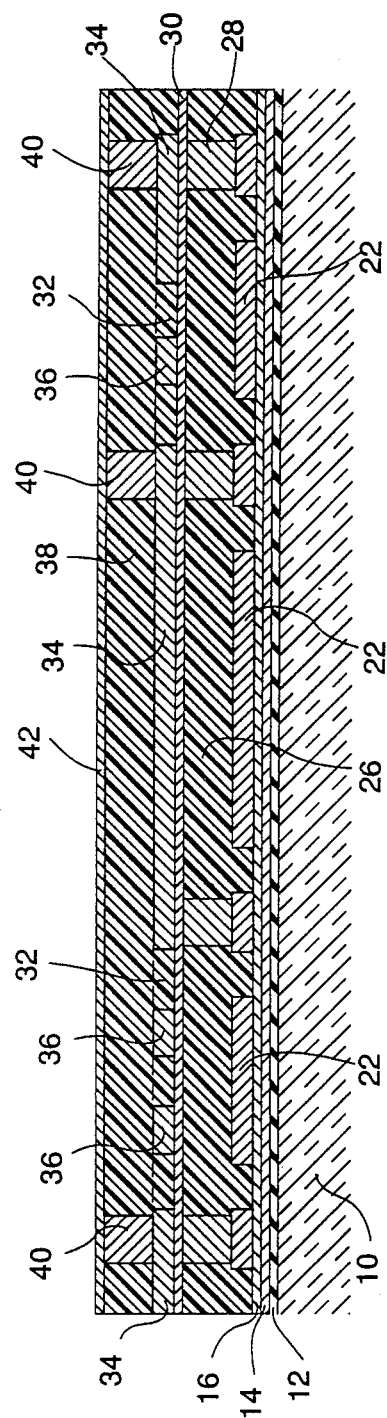

After the step described in FIG. 6, the steps described above can be repeated in sequential manner until the desired number of levels for the interconnect are obtained. That is, for each additional layer of conductors desired, the steps disclosed in FIGS. 2 through 6 are sequentially performed. Thus, as best seen in FIG. 7, after applying the metal seed layer 30, another photopolymer mask 32 is applied over the layer 30, and a layer of an electrical conductor, such as copper, is applied to form parts of a second layer of conductors such as X conductors 34, Y conductors 36, as well as parts of support and via pillars. Thereafter, another portion 38 of photoresist is applied, similar to the step in FIG. 4, to provide the mask 38 for extension of the support and via pillars. The via pillars 40 are electroplated, as in FIG. 5, and thereafter another metal seed layer of copper 42 is applied, similar to FIG. 6. Note that the various layers 18, 26, 32 and 38 of the photopolymers serve the function of both patterning the metal interconnects and support pillars as well as providing support to the metal conductors during the multilevel construction.

Figure 8:
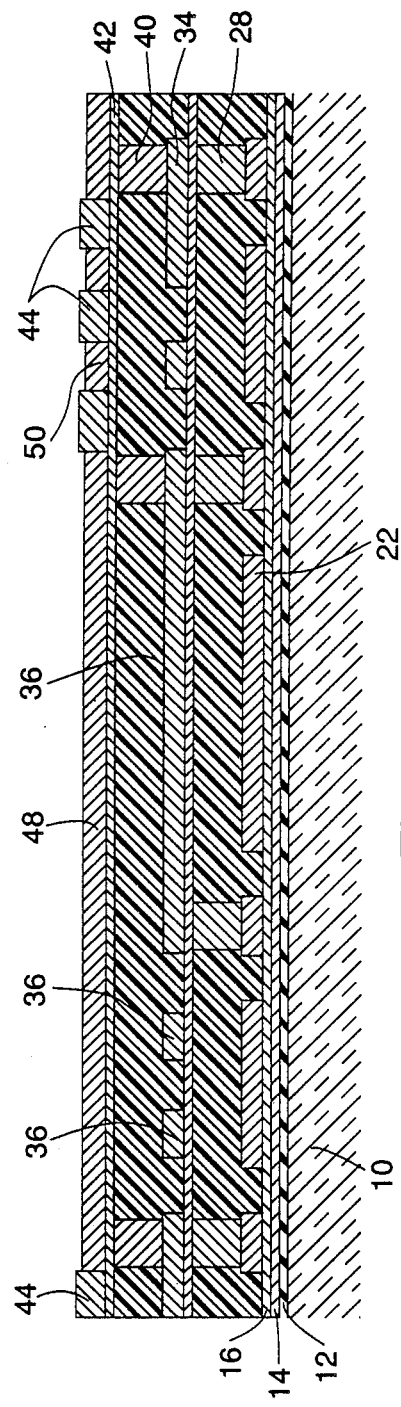

Referring to FIG. 8, if a total of three air bridge levels are desired, the process described in FIGS. 2 and 3 are provided to make a third conductor level, that is, a second elevated level. Again, similar to FIG. 2, a mask 44 is applied over the seed layer 42 and another electrical conductor layer 46, such as copper, is electroplated thereon.

Electroplated layer 46 may provide one or more X conductors 48 and one or more Y conductors 50. At last additive step could be used to plate I/O bond pads (not shown) which can be elevated higher than the top conductor layer.

Figure 9:
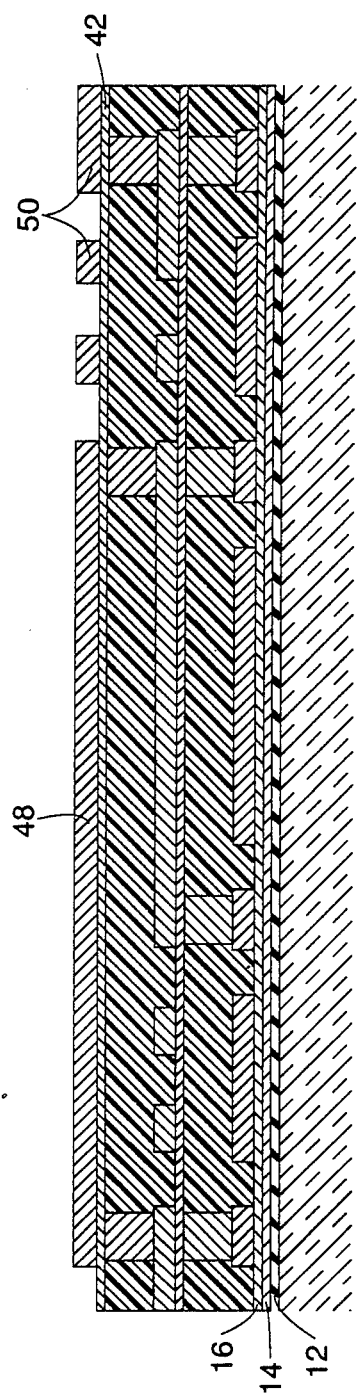

After completion of all of the additive steps, as shown in FIG. 9, the resulting substrate is a multilayer sandwich of patterned metal conductors and pillars, sitting on thin plating metal seed layers, with photoresist in between. At this point, the subtractive part of the manufacturing method can be done.

Referring to FIG. 9, the top resist (resist 44 in FIG. 8) is stripped off such as by using a solvent type stripper. Spray stripping could be used to yield a more complete removal. Because the thin metal seed film 42 protects the underlying photoresist, the underlying layers of resist will not be stripped.

Figure 10:
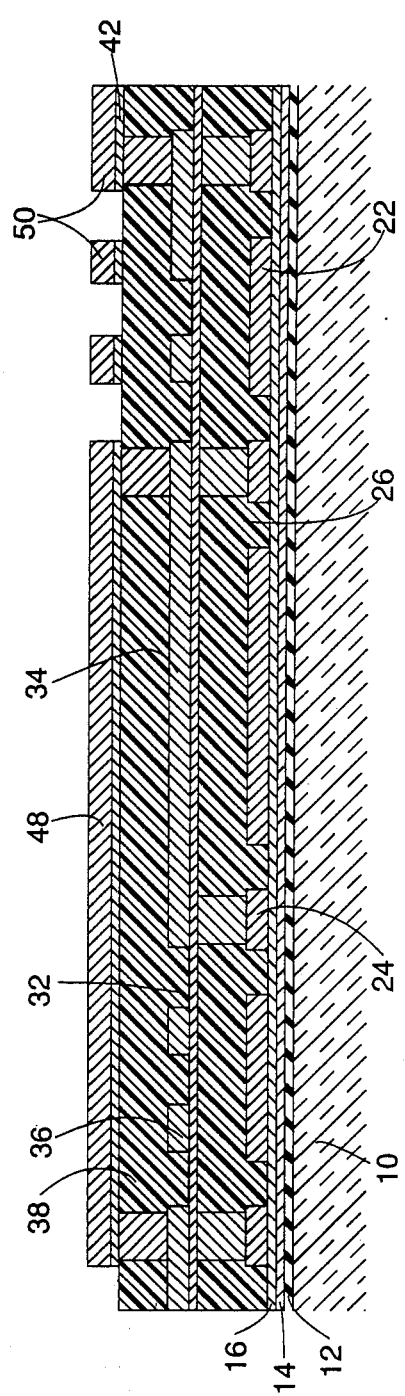

The plating seed layer 42 is then etched off, as best seen in FIG. 10, by using a mild copper etchant such as ammonium persulfate/phosphoric acid solution. If desired, spray etching could be used to yield a more uniform removal.

Figure 11:
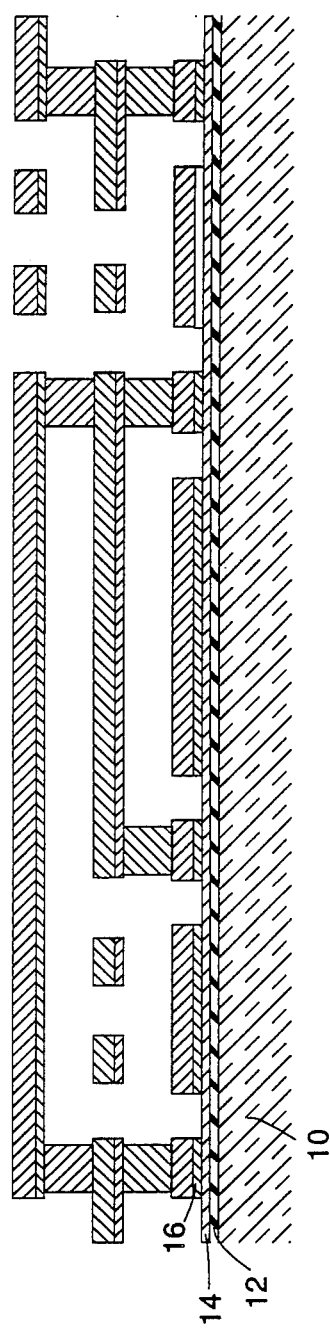
Figure 12:
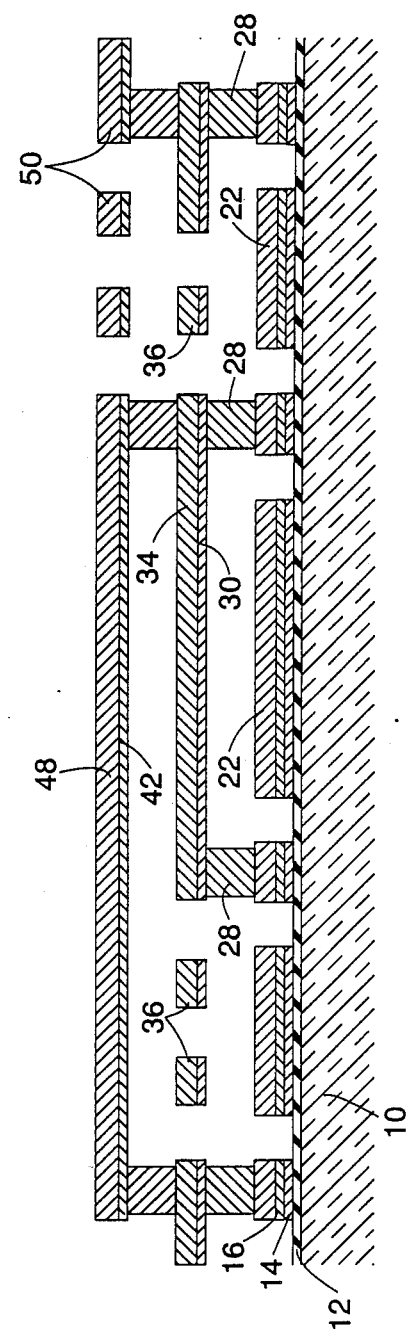
Figure 13:
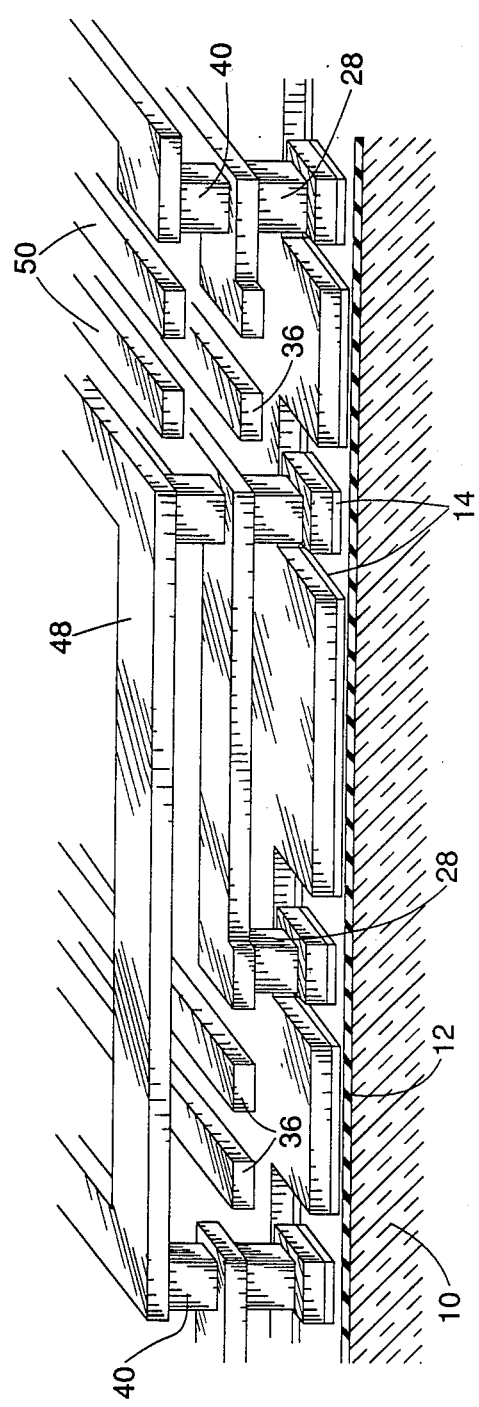
FIG. 13 is a perspective elevational view of the interconnect of FIG. 12.

The stripping of the photoresist and of the metal seed layers 30 and 16 is accomplished twice to the structure of FIG. 10 to provide the structure of FIG. 11. The polymer strip and metal seed layer strip is the same as described in connection with FIGS. 9 and 10. These steps leave the three layer air bridge structure on top of the chromium adhesion layer 14, providing an adhesive layer was applied. The chromium adhesion layer is then etched by any suitable etch, such as alkaline ferricyanide solutions. This results in the structure shown in FIGS. 12 and 13. Thereafter, the structure is rinsed thoroughly and spin-dried. The air bridges with spans of 500 microns and having cross sections of $5 \times 15$ microns should not collapse upon spin-drying or sprayrinsing. It is to be noted in the etching of the metal seed layers 42, 30 and 16, that there will be a slight dimensional loss to the electrical conductors and metal bridges if they are of the same materials as the seed layers. However, since the seed layers are much thinner, the loss to the electrical conductors and bridges is insignificant.

The present invention, therefore, is well adapted to carry out the objects and attain the ends and advantages mentioned, as well as others inherent therein. While a presently preferred embodiment of the invention has been described for the purpose of disclosure, numerous changes in the details of construction, and steps of the process, will be readily apparent to those skilled in the art and which are encompassed within the spirit of the invention and the scope of the appended claims.

What is claimed is:

1. A method of making a multilevel electrical airbridge interconnect on a substrate comprising, applying a metal seed layer over an underlying layer, selectively patterning a photopolymer mask on the metal seed layer, applying an electrically conductive layer on the unmasked portion of the metal seed layer for forming a first conductor lavel and a first part of metal support pillars, adding a second layer of a photopolymer mask for forming another part of the support pillars, applying another part of the metal support pillars to the first part of the metal support pillars, applying a second metal seed layer over the second mask and said another part layer of the metal pillars, repeating these steps one or more times for building additional levels of metal pillar supported conductors, and sequentially removing the seed and mask layers leaving electrical conductors supported from metal pillars with a dielectric therebetween.

2. The method of claim 1 wherein the removing of the seed layers and mask layers are separately performed beginning at the top.

3. The method of claim 1 wherein the metal seed layers are applied by evaporation and the electrical conductor layers and pillars are applied by electroplating.

4. The method of claim 3 wherein the electroplating, prior to the applying of the next seed layer, is electroplated approximately flush with the resist mask.

5. The method of claim 1 wherein a dielectric layer is applied between the substrate and the first metal seed layer.

6. The method of claim 1 wherein an adhesive layer is applied between the substrate and the first metal seed layer.

7. The method of claim 6 wherein the adhesive layer is sequentially removed.

8. The method of claim 1 wherein the dielectric is air.

9. The method of claim 1 wherein the dielectric is backfilled.

10. A method of making a multilevel electrical airbridge interconnect comprising, applying a dielectric layer over a substrate, applying an adhesion layer over the dielectric, applying an metal seed layer over the adhesion layer, selectively patterning a photopolymer mask on the metal seed layer, applying an electrically conductive non-seed layer on the unmasked portion of the metal seed layer for forming a first conductor level and a first part of metal support pillars, adding a second layer of a photopolymer mask for forming another part of the support pillars, applying another part of the metal support pillars to the first part of the metal support pillars, applying a second metal seed layer over the second mask and said another part layer of the metal pillars, repeating steps three through eight one or more times for building additional levels of metal pillar supported conductors, and sequentially removing the seed layers and the mask layers leaving electrical conductors supported from metal pillars with an air dielectric therebetween.

11. The method of claim 10 wherein the removing of the seed layers and mask layers are separately performed beginning at the top.

12. The method of claim 11 wherein the metal seed layers are applied by evaporation and the conductor layers and pillars are applied by electroplating.

13. The method of claim 10 wherein the electroplating, prior to the applying of the next seed layer, is electroplated flush with the resist mask.

14. A method of making a multilevel electrical airbridge interconnect on a substrate comprising, applying a metal seed layer over an underlying layer, selectively patterning a photopolymer mask on the metal seed layer, applying an electrically conductive layer on the unmasked portion of the metal seed layer for forming a first conductor level and a first part of metal support pillars, adding a second layer of a photopolymer mask for forming another part of the support pillars, applying another part of the metal support pillars to the first part of the metal support pillars, repeating these steps one or more times for building additional levels of metal pillar supported conductors, and sequentially removing the seed and mask layers leaving electrical conductors supported from metal pillars with a dielectric therebetween.

15. The method of claim 14 wherein the removing of the seed layers and mask layers are separately performed beginning at the top.

16. The method of claim 14 wherein the metal seed layers are applied by evaporation and the electrical conductor layers and pillars are applied by electroplating.

17. The method of claim 14 wherein the electroplating, prior to the applying of the next seed layer, is electroplated approximately flush with the resist mask.

18. The method of claim 14 wherein a dielectric layer is applied between the substrate and the first metal seed layer.

19. The method of claim 14 wherein an adhesive layer is applied between the substrate and the first metal seed layer.

20. The method of claim 19 wherein the adhesive layer is sequentially removed.

21. The method of claim 14 wherein the dielectric is air.

22. The method of claim 14 wherein the dielectric is backfilled.

* * * * *

UNITED STATES PATENT AND TRADEMARK OFFICE
CERTIFICATE OF CORRECTION

PATENT NO. : 4,920,639

DATED : May 1, 1990

INVENTOR(S) : Ian Y. K. Yee

It is certified that error appears in the above-identified patent and that said Letters Patent is hereby corrected as shown below:

Column 4, line 34, delete "At" and insert --A--.

Column 5, line 25, delete "lavel" and insert --level--.

Signed and Sealed this

Twenty-second Day of September, 1992

Attest:

DOUGLAS B. COMER

*Attesting Officer*  *Acting Commissioner of Patents and Trademarks*